United States Patent
Kuramochi

(10) Patent No.: US 7,712,649 B2
(45) Date of Patent: May 11, 2010

(54) USING A SIMULTANEOUSLY TILTING AND MOVING BONDING APPARATUS

(75) Inventor: Toshiyuki Kuramochi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 12/146,936

(22) Filed: Jun. 26, 2008

(65) Prior Publication Data

US 2009/0001133 A1    Jan. 1, 2009

(30) Foreign Application Priority Data

Jun. 27, 2007    (JP)    ............... 2007-168502

(51) Int. Cl.
*B23K 31/12*    (2006.01)
*B23K 31/00*    (2006.01)
*H05K 3/00*    (2006.01)

(52) U.S. Cl. ............. 228/103; 228/179.1; 29/843

(58) Field of Classification Search ......... 228/102–106, 228/5.5, 8, 9, 12, 179.1–180.22; 29/832, 29/834, 841, 739, 740, 741

See application file for complete search history.

(56) References Cited

U.S. PATENT DOCUMENTS

| | | | |
|---|---|---|---|
| 3,722,062 A * | 3/1973 | Gharaibeh | 29/703 |
| 4,370,804 A * | 2/1983 | Misawa et al. | 29/741 |
| 4,600,228 A * | 7/1986 | Tarbuck | 294/64.1 |
| 4,899,921 A * | 2/1990 | Bendat et al. | 228/105 |
| 5,029,383 A * | 7/1991 | Snyder et al. | 29/740 |
| 5,036,582 A * | 8/1991 | Usui | 29/740 |
| 5,127,573 A * | 7/1992 | Chang et al. | 228/180.22 |
| 5,185,509 A * | 2/1993 | Todd et al. | 219/85.16 |
| 5,262,355 A * | 11/1993 | Nishiguchi et al. | 29/833 |
| 5,384,000 A * | 1/1995 | Nishiguchi | 156/297 |
| 5,462,217 A * | 10/1995 | Simmons et al. | 228/180.22 |
| 5,489,758 A * | 2/1996 | Nihei et al. | 219/121.63 |
| 5,536,974 A * | 7/1996 | Nishiguchi | 257/778 |
| 5,680,698 A * | 10/1997 | Armington et al. | 29/833 |
| 5,745,986 A * | 5/1998 | Variot et al. | 29/840 |
| 5,804,983 A * | 9/1998 | Nakajima et al. | 324/758 |
| 6,006,978 A * | 12/1999 | Swanson | 228/44.7 |

(Continued)

FOREIGN PATENT DOCUMENTS

JP    2004-047670    2/2004

*Primary Examiner*—Jessica L. Ward
*Assistant Examiner*—Carlos Gamino
(74) *Attorney, Agent, or Firm*—Rankin, Hill & Clark LLP

(57) ABSTRACT

An electronic component mounting device according to the invention includes a bonding head for holding and pressure bonding an electronic component to a mounting substrate, a local stage provided with a support surface formed in an area which is almost equal to or slightly larger than that of a mounting surface of the electronic component and serving to support a pressure bonding force from an antimounting surface of the mounting substrate through the support surface, a length measuring mechanism for measuring a distance between the bonding head and the mounting substrate, thereby calculating a virtual plane in a predetermined mounting position on the mounting substrate, and a tilting and moving mechanism for tilting and moving the bonding head and the local stage, thereby causing a normal of the virtual plane in the mounting position to be coincident with an action line of the pressure bonding force, and the pressure bonding is carried out along the normal.

6 Claims, 16 Drawing Sheets

U.S. PATENT DOCUMENTS

| | | | |
|---|---|---|---|
| 6,010,056 A * | 1/2000 | Swanson | 228/44.3 |
| 6,041,996 A * | 3/2000 | Arikado | 228/180.22 |
| 6,048,656 A * | 4/2000 | Akram et al. | 438/118 |
| 6,056,184 A * | 5/2000 | Luchinger et al. | 228/33 |
| 6,179,938 B1 * | 1/2001 | Mannhart et al. | 156/64 |
| 6,302,313 B1 * | 10/2001 | Tanaka | 228/102 |
| 6,561,408 B2 * | 5/2003 | Hosotani et al. | 228/44.7 |
| 6,774,651 B1 * | 8/2004 | Hembree | 324/758 |
| 6,978,534 B2 * | 12/2005 | Sakaki | 29/740 |
| 6,981,312 B2 * | 1/2006 | Rezaei | 29/740 |
| 6,992,397 B1 * | 1/2006 | Nguyen | 257/778 |
| 7,066,373 B2 * | 6/2006 | Behler | 228/103 |
| 7,147,735 B2 * | 12/2006 | Caskey et al. | 156/73.5 |
| 7,219,824 B2 * | 5/2007 | Tu et al. | 228/5.5 |
| 7,355,386 B2 * | 4/2008 | Siade et al. | 324/158.1 |
| 7,368,930 B2 * | 5/2008 | Hobbs et al. | 324/758 |

* cited by examiner

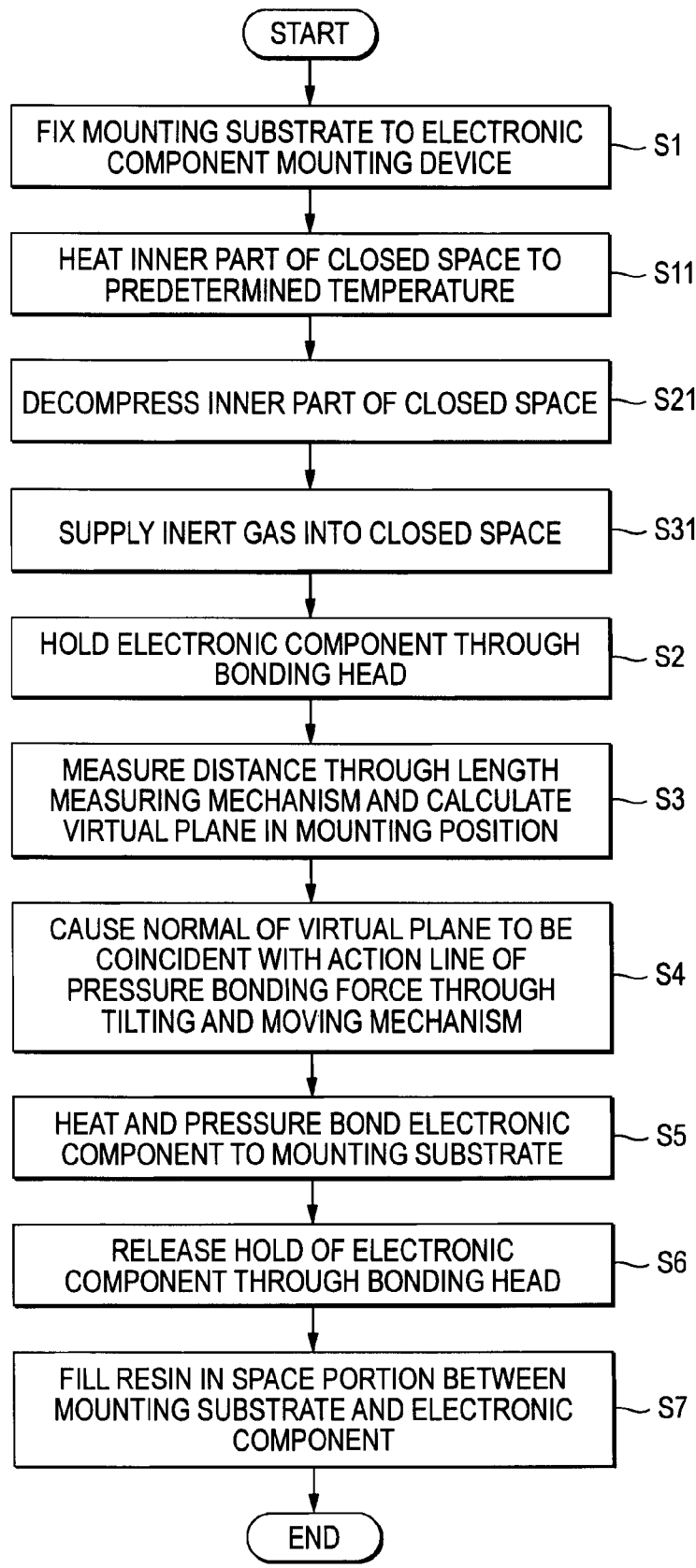

USING A SIMULTANEOUSLY TILTING AND MOVING BONDING APPARATUS

BACKGROUND OF THE INVENTION

The present invention relates to an electronic component mounting device and a method of manufacturing an electronic device, and more particularly to an electronic component mounting device for sequentially mounting a plurality of electronic components on a mounting substrate and a method of manufacturing an electronic device constituted by mounting the electronic component on the mounting substrate using the electronic component mounting device.

As an example in which an electronic component is mounted on a mounting substrate, there is taken an electronic device for flip-chip connecting a semiconductor chip to a mounting wiring board. The electronic device generally has a structure in which a space portion between the mounting substrate and the electronic component mounted on the mounting substrate is filled with an underfill resin. In an example of an actual manufacturing process, there is employed a method of connecting a plurality of electronic components to a mounting substrate having a large area one by one in a matrix and finally making a division as each electronic device.

In recent years, however, a reduction in a thickness of the mounting substrate has been progressed and a warpage is inevitably generated on the mounting substrate. As will be described below, the warpage might cause a breakdown and breakage of a connecting portion of the mounting substrate and the electronic component. For this reason, a countermeasure has variously been investigated.

FIG. 15 shows an example of a method of mounting an electronic component which has conventionally been executed in order to eliminate the warpage by the applicant. First of all, a mounting substrate 102 having a warpage generated thereon (see FIG. 15A) is decompressed and adsorbed through a batch adsorbing and fixing stage 112 and is thus corrected into a state in which the warpage is not generated. In that state, the mounting substrate 102 is heated to a predetermined temperature through a heater (not shown) provided in the batch adsorbing and fixing stage 112 and an electronic component 103 held on a bonding head (not shown) is subjected to pressure bonding to the mounting substrate 102, thereby carrying out a flip-chip connection (see FIG. 15B). After a plurality of electronic components 103 is sequentially connected in a matrix, the decompression and adsorption of the mounting substrate 102 through the batch adsorbing and fixing stage 112 is released so that the mounting step is completed. At this time, an action for causing the mounting substrate 102 to recover into an original warping state (hereinafter referred to as a "warpage recovery") is generated in an electronic device 110 on which the electronic component 103 is mounted (see FIG. 15C).

On the other hand, an electronic component mounting device 200 described in Patent Document 1 is taken as a conventional example of a mounting device capable of carrying out a flip-chip connection having a small warpage (see FIG. 16). The electronic component mounting device 200 comprises a chip adsorbing block 201 including heating means 202 and a stage 223 including substrate adsorbing means 227 and substrate cooling means 225, and has such a structure that the heating means 202, the substrate adsorbing means 227 and the substrate cooling means 225 are operated at the same time. For the action, a substrate 205 is adsorbed and held on the stage 223 and a flip-chip 203 adsorbed and held on the chip adsorbing block 201 is heated and pressurized onto the substrate 205 through a plunger 204, and at the same time, the substrate 205 is forcibly cooled from the stage 223 side.

[Patent Document 1] JP-A-2004-47670

In the case in which the mounting substrates are decompressed and adsorbed in a batch as described above, however, a recovery of a deformation of the substrate, that is, a warpage recovery is generated in the release of the decompression and adsorption. Therefore, a breakdown and breakage of a flip-chip connecting portion, for example, a crack 111 in FIG. 15C might be caused, for example.

Moreover, the electronic device is moved and delivered between a flip-chip connecting step and an underfill resin filling step as a normal manufacturing process. Also in the meantime, a drop in a temperature and a deformation of the mounting substrate therewith might be generated, and therefore, there has also been an obvious problem in that the breakdown and breakage of the connecting portion is caused thereby.

In a process for mounting an electronic component which is carried out by heating a whole mounting substrate according to the conventional art, furthermore, the mounting substrate has a high temperature. In the case in which an underfill resin is filled at the same time, therefore, there is a problem such as a filling failure caused by curing the underfill resin.

SUMMARY OF THE INVENTION

In consideration of the circumstances, it is an object of the invention to provide an electronic component mounting device which can mount a plurality of electronic components in a warping state without correcting a warpage of a mounting substrate through an adsorption in the case in which the electronic components are sequentially mounted on the mounting substrate, thereby preventing a breakdown and breakage of a flip-chip connecting portion from being caused by a warpage recovery in a release of the adsorption, and a method of manufacturing an electronic device using the electronic component mounting device.

Furthermore, it is an object of the invention to provide an electronic component mounting device which can cancel a step of moving and delivering a mounting substrate by filling a resin into a space portion immediately after an electronic component is heated and pressure bonded to the mounting substrate, thereby preventing a drop in a temperature and a deformation of the mounting substrate and a breakdown and breakage of an electronic component connecting portion from being caused by the movement and delivery, and a method of manufacturing an electronic device using the electronic component mounting device.

The invention solves the problems by solving means which will be described below.

According to a first aspect of the invention, there is provided an electronic component mounting device for sequentially mounting a plurality of electronic components on a mounting substrate, including:

a bonding head for holding and pressure bonding the electronic components to the mounting substrate, a local stage provided with a support surface formed in an area which is almost equal to or slightly larger than that of a mounting surface of the electronic component, and supporting a pressure bonding force from an antimounting surface of the mounting substrate through the support surface, a length measuring mechanism for measuring a distance between the bonding head and the mounting substrate to calculate a virtual plane in a predetermined mounting position on the mounting substrate, and a tilting and moving mechanism for tilting and moving the bonding head and the local stage to cause a normal of the virtual plane in the mounting position to be coincident with an action line of the pressure bonding force, wherein the pressure bonding is carried out along the normal.

Further, according to a second aspect of the invention, there is provided the electronic component mounting device according to the first aspect, further including:

at least one of a heater for heating the electronic component which is provided in the bonding head and a heater for heating the mounting substrate which is provided in the local stage.

Further, according to a third aspect of the invention, there is provided the electronic component mounting device according to the first or second aspect, further including:

a resin filling mechanism for filling a resin in a space portion between the mounting substrate and the electronic component mounted on the mounting substrate.

Further, according to a forth aspect of the invention, there is provided the electronic component mounting device according to any one of the first to third aspects, which is disposed in a closed space capable of regulating a temperature in an internal atmosphere.

Further, according to a fifth aspect of the invention, there is provided the electronic component mounting device according to the forth aspect, further including:

a decompressing mechanism for decompressing an inner part, which is provided in the closed space.

Further, according to a sixth aspect of the invention, there is provided the electronic component mounting device according to the fifth aspect, further including:

a gas supplying mechanism for supplying an inert gas to the inner part, which is provided in the closed space.

Further, according to a seventh aspect of the invention, there is provided a method of manufacturing an electronic device which sequentially mounts a plurality of electronic components to a mounting substrate, including the steps of:

measuring a distance between a bonding head for holding and pressure bonding the electronic components to the mounting substrate and the mounting substrate to calculate a virtual plane in a predetermined mounting position on the mounting substrate, tilting and moving the bonding head and a local stage for supporting a pressure bonding force from an antimounting surface of the mounting substrate to cause a normal of the virtual plane in the mounting position to be coincident with an action line of the pressure bonding force, and carrying out the pressure bonding along the normal.

Further, according to an eighth aspect of the invention, there is provided the method of manufacturing an electronic device according to the seventh aspect, wherein the step of carrying out the pressure bonding is executed in at least one of a state in which the electronic component is heated through the bonding head and a state in which the mounting substrate is heated through the local stage.

Further, according to a ninth aspect of the invention, there is provided the method of manufacturing an electronic device according to the seventh or eighth aspect, wherein a step of filling a resin in a space portion between the mounting substrate and the electronic component mounted on the mounting substrate is executed subsequently to the step of carrying out the pressure bonding in a closed space in which an internal atmosphere is regulated to have a predetermined temperature.

Further, according to a tenth aspect of the invention, there is provided the method of manufacturing an electronic device according to the ninth aspect, wherein an inner part of the closed space is set in a decompressing state.

According to the invention, it is possible to omit a mechanism for decompressing and adsorbing or electrostatically adsorbing a mounting substrate provided in a conventional electronic component mounting device. More specifically, also in the case in which the warpage of the mounting substrate which is caused by the adsorption does not need to be corrected and the warpage is generated, the electronic component and the mounting substrate can be pressure bonded to each other along the normal of the virtual plane on the center of the mounting position depending on the warping state. Accordingly, it is possible to prevent a breakdown and breakage of the flip-chip connecting portion from being caused by the warpage recovery in the release of the adsorption of the mounting substrate.

According to the invention, moreover, it is possible to fill the resin into the space portion through the resin filling mechanism immediately after heating and pressure bonding the electronic component to the mounting substrate. Thus, it is possible to cancel the step of moving and delivering the mounting substrate. Consequently, it is possible to prevent a drop in a temperature and a deformation of the mounting substrate and a breakdown and breakage of the electronic component connecting portion from being caused by the movement and delivery between the steps.

According to the invention, furthermore, it is possible to provide the closed space and to heat and pressure bond the electronic component to the mounting substrate therein. When filling the resin in the space portion between the mounting substrate and the electronic component, particularly, it is possible to heat the whole inner part of the closed space through the temperature regulating mechanism in place of the heater in the local stage. Consequently, it is not necessary to carry out an individual heating control every filling place. Thus, it is possible to stably fill the resin.

According to the invention, moreover, it is possible to fill the resin in the space portion between the mounting substrate and the electronic component in a state in which the inner part of the closed space is decompressed. As a result, it is possible to prevent a void from being contained in the resin which is filled. Consequently, it is possible to prevent a damage such as a breakdown of the connecting portion from being caused by the void. Thus, it is possible to stabilize quality of the electronic device.

In addition, the inert gas is supplied into the closed space with the decompression, and at the same time, the electronic component and the mounting substrate are pressure bonded to each other. Consequently, it is possible to prevent the surface of the solder in the mounting substrate or the electronic component from being oxidized. Thus, it is possible to carry out a reliable connection.

BRIEF DESCRIPTION OF THE DRAWINGS

FIG. 14 is a flowchart showing a procedure for a method of manufacturing an electronic device using the electronic component mounting device in FIG. 13.

DETAILED DESCRIPTION OF THE PREFERRED EMBODIMENTS

Figure 1:
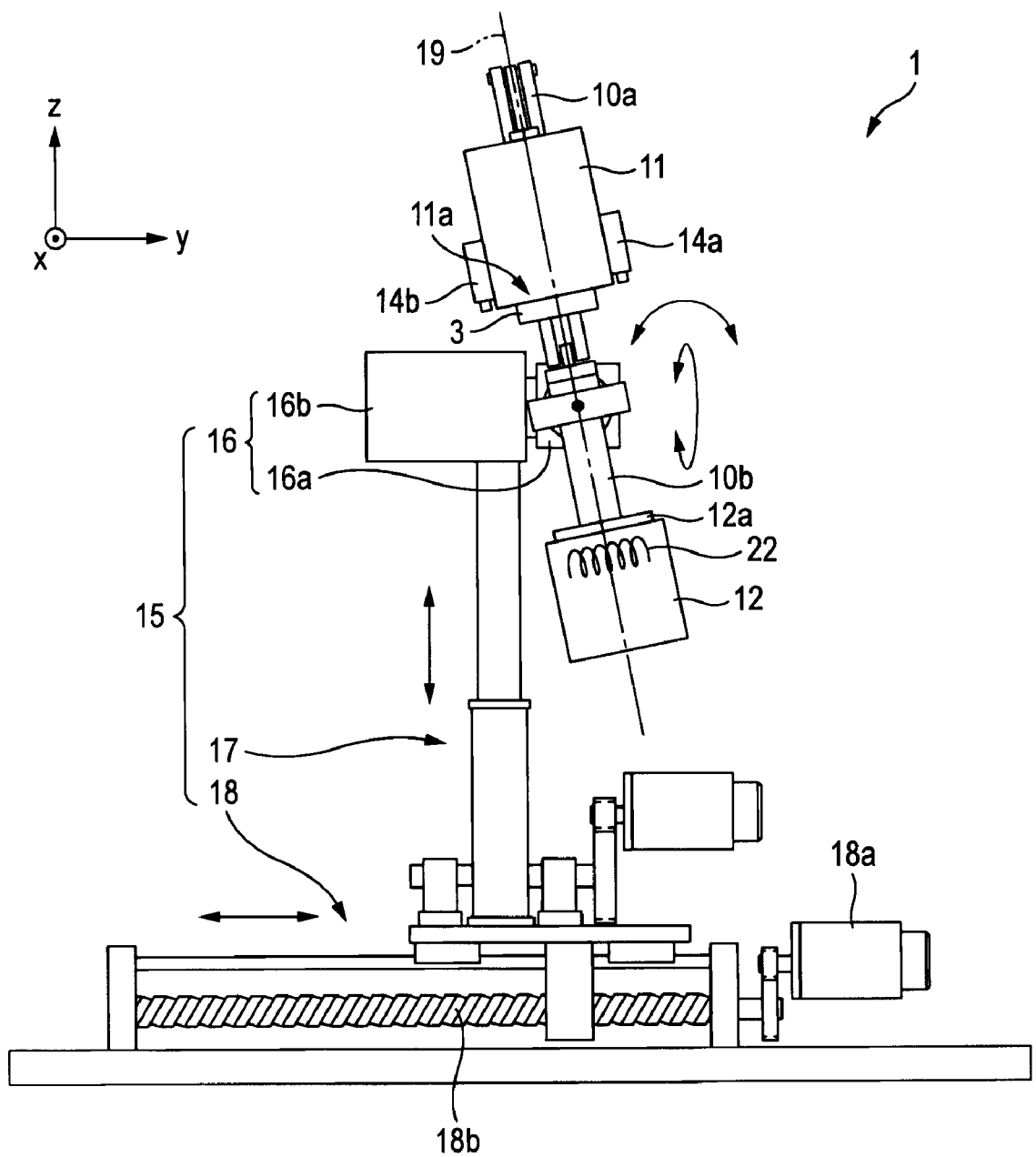
FIG. 1 is a schematic view showing an example of an electronic component mounting device according to an embodiment of the invention.
Figure 2A:
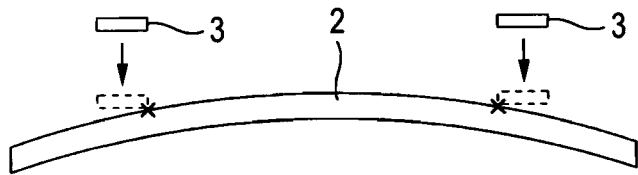
FIGS. 2A to 2D are views for explaining an action of the electronic component mounting device in FIG. 1.
Figure 3:
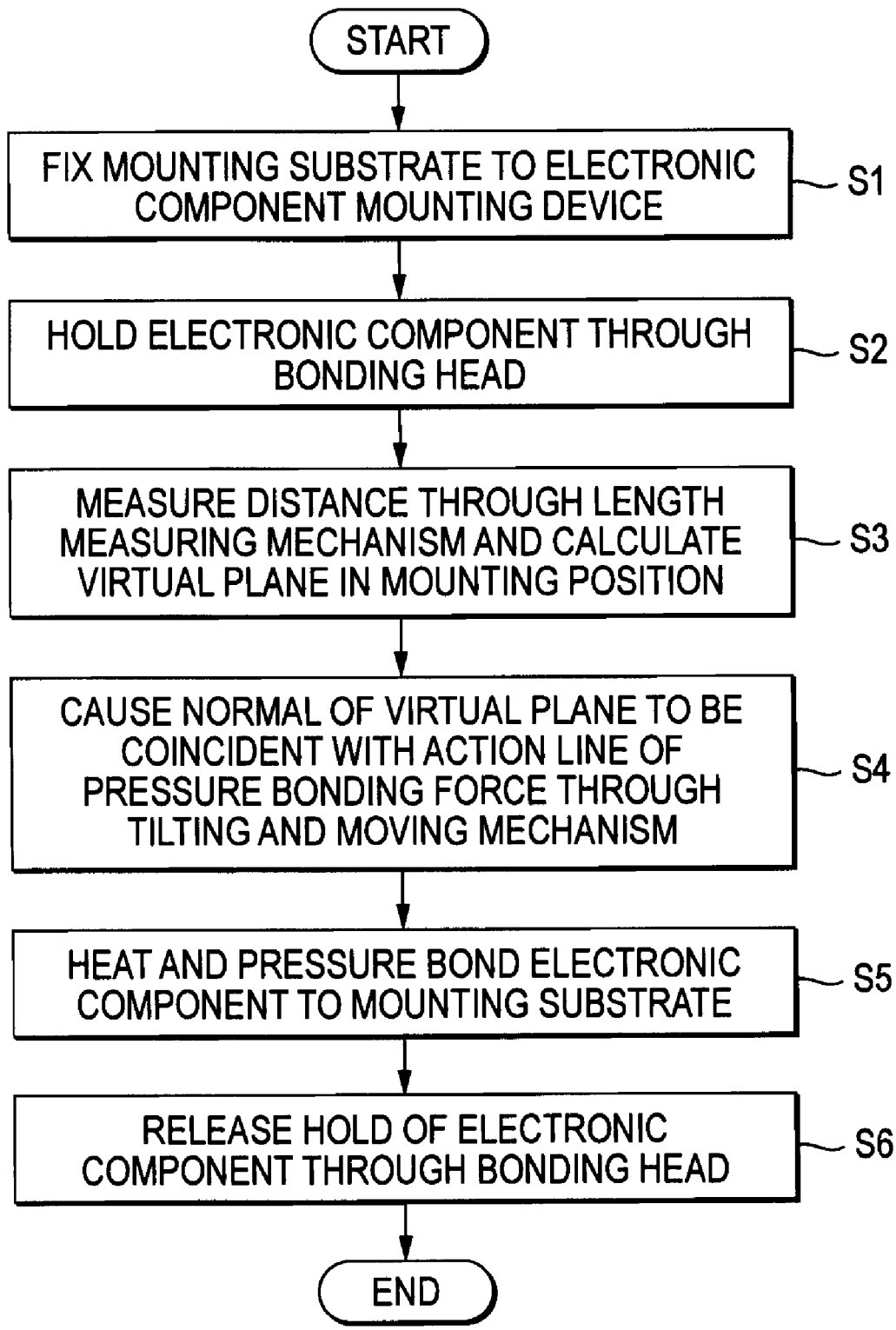
FIG. 3 is a flowchart showing a procedure for a method of manufacturing an electronic device using the electronic component mounting device in FIG. 1.
Figure 4:
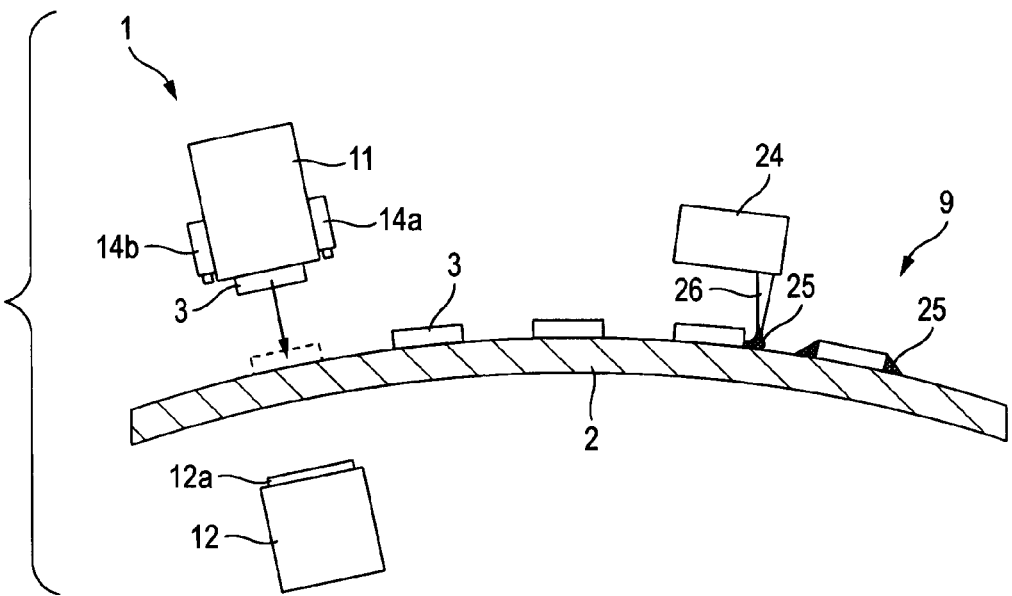
FIG. 4 is a schematic view showing an example of an electronic component mounting device according to a second embodiment of the invention.
Figure 5A:
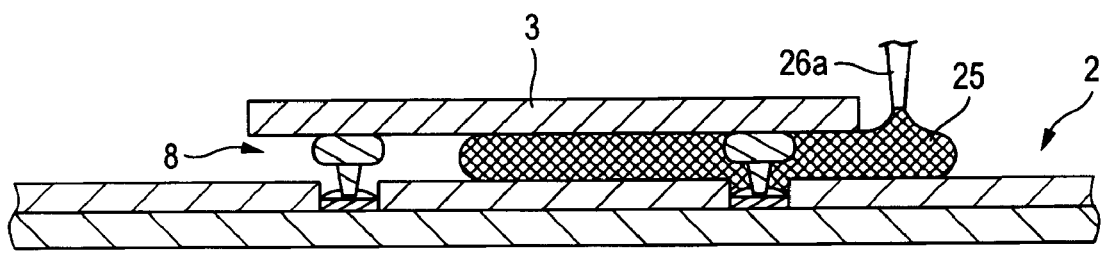
FIGS. 5A and 5B are views for explaining an action of the electronic component mounting device in FIG. 4.
Figure 5B:
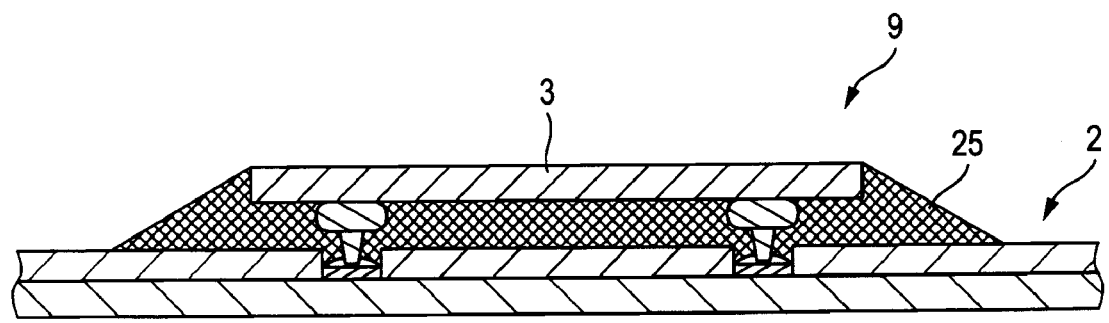
Figure 6:
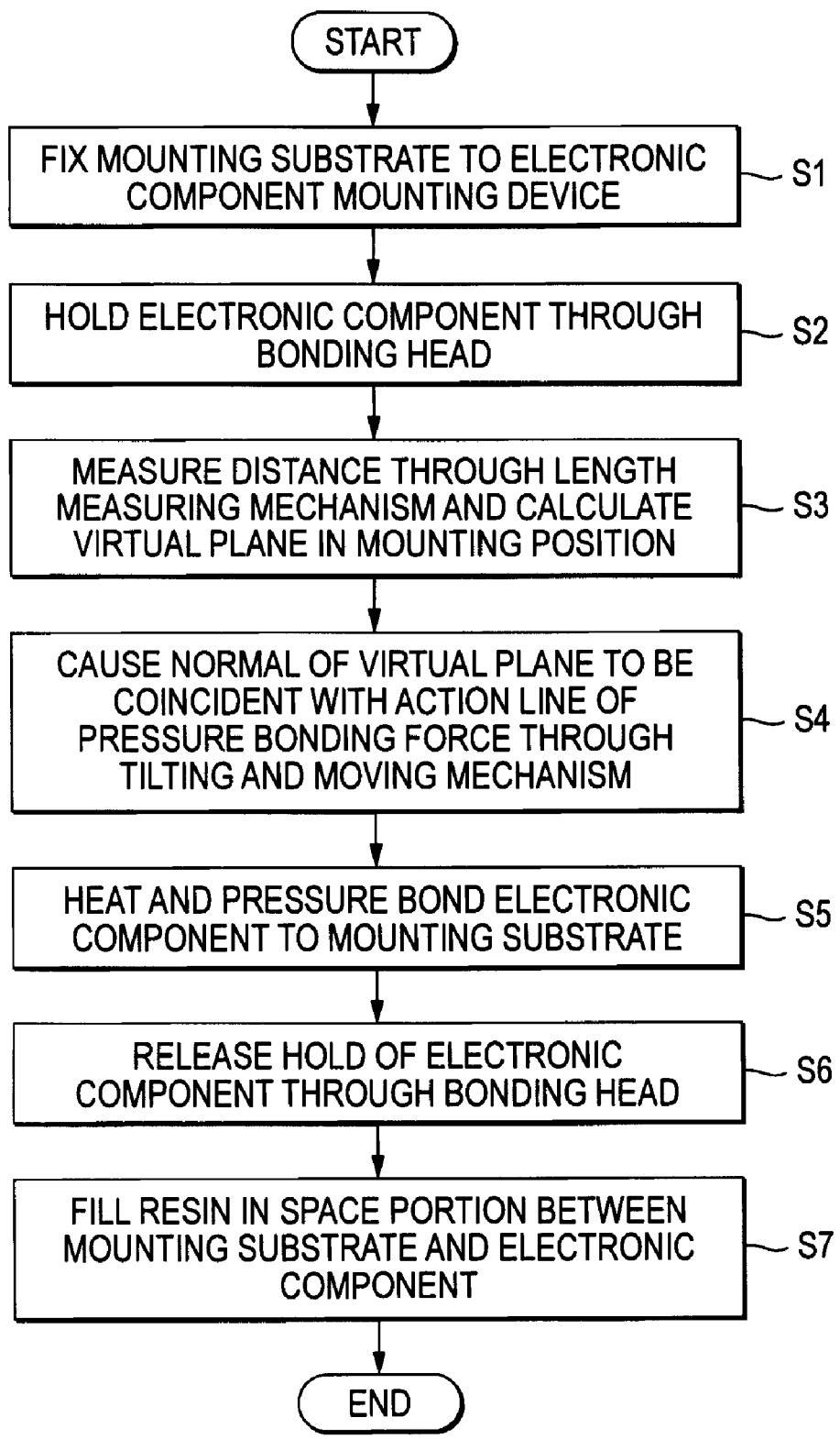
FIG. 6 is a flowchart showing a procedure for a method of manufacturing an electronic device using the electronic component mounting device in FIG. 4.
Figure 7:
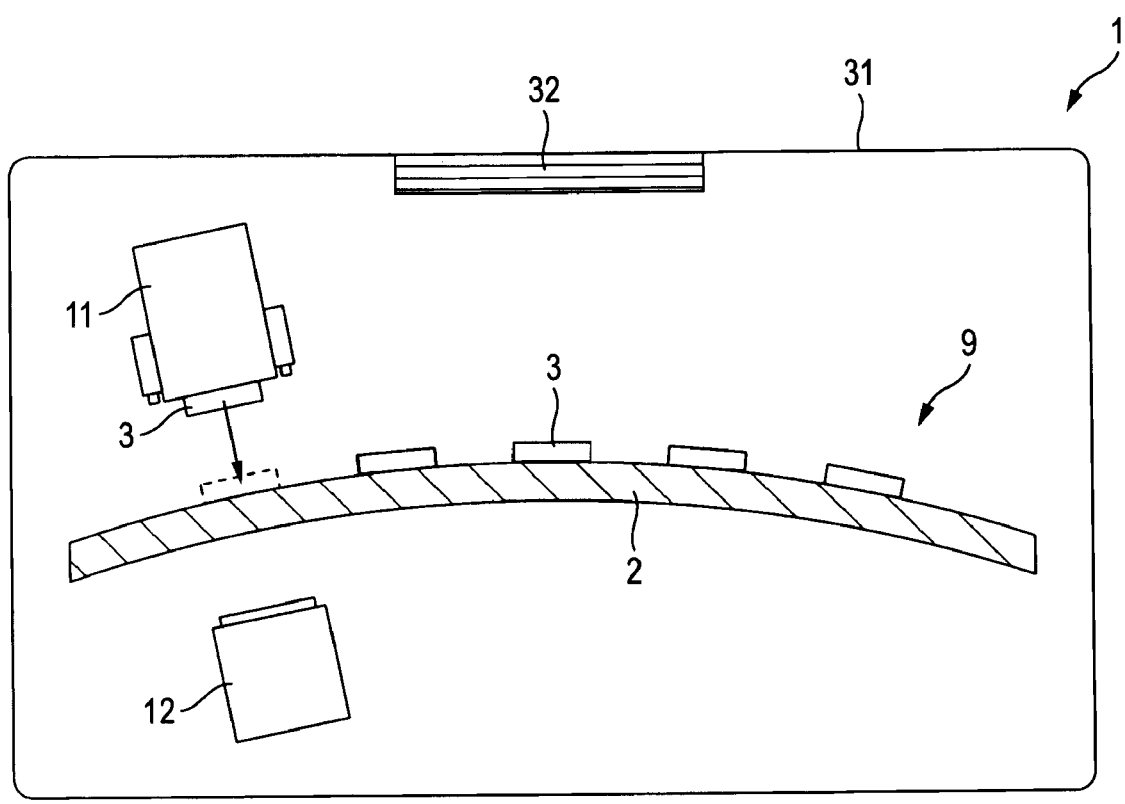
FIG. 7 is a schematic view showing an example of an electronic component mounting device according to a third embodiment of the invention.
Figure 8:
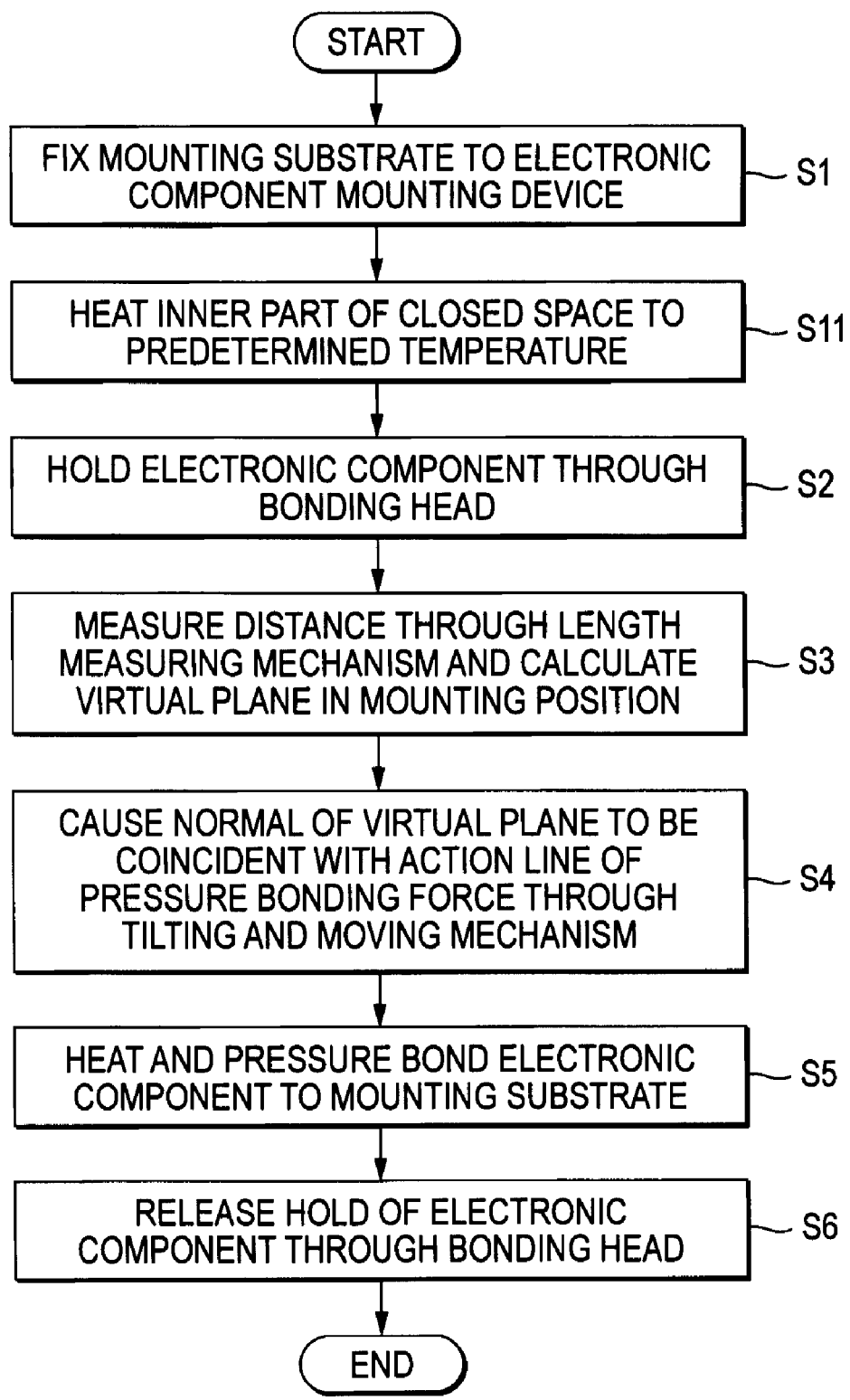
FIG. 8 is a flowchart showing a procedure for a method of manufacturing an electronic device using the electronic component mounting device in FIG. 7.
Figure 9:
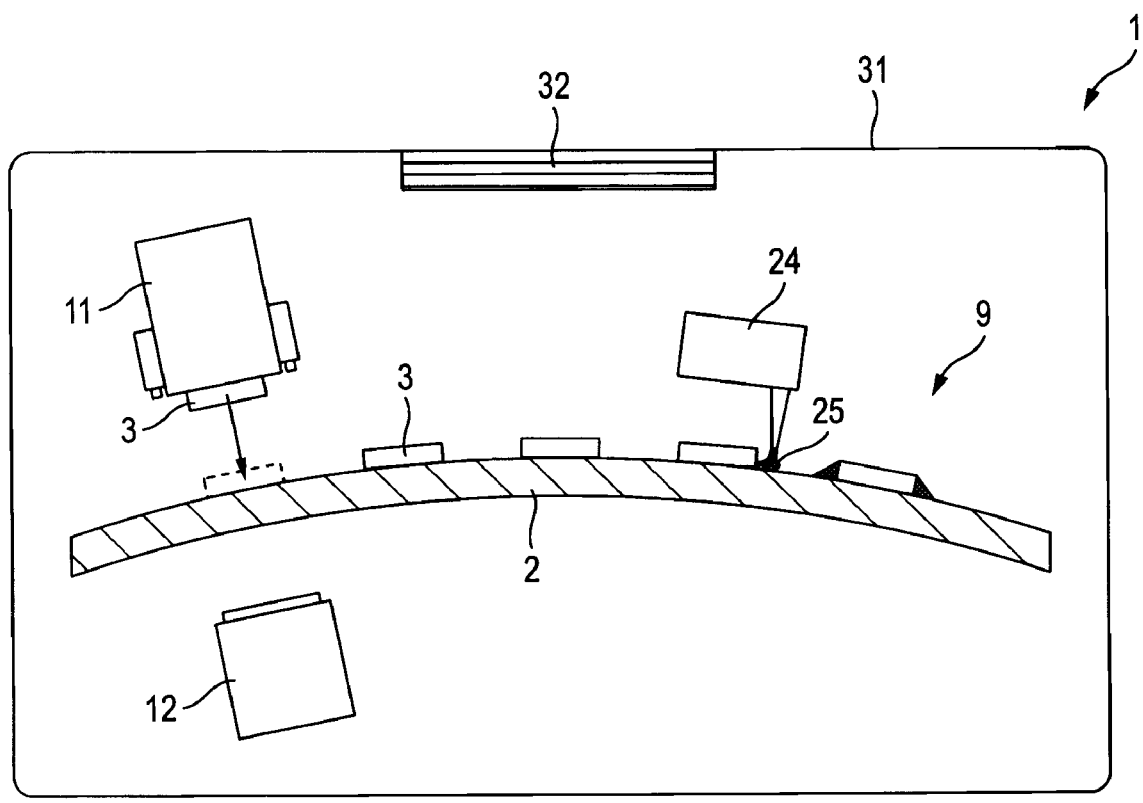
FIG. 9 is a schematic view showing an example of an electronic component mounting device according to a fourth embodiment of the invention.
Figure 10:
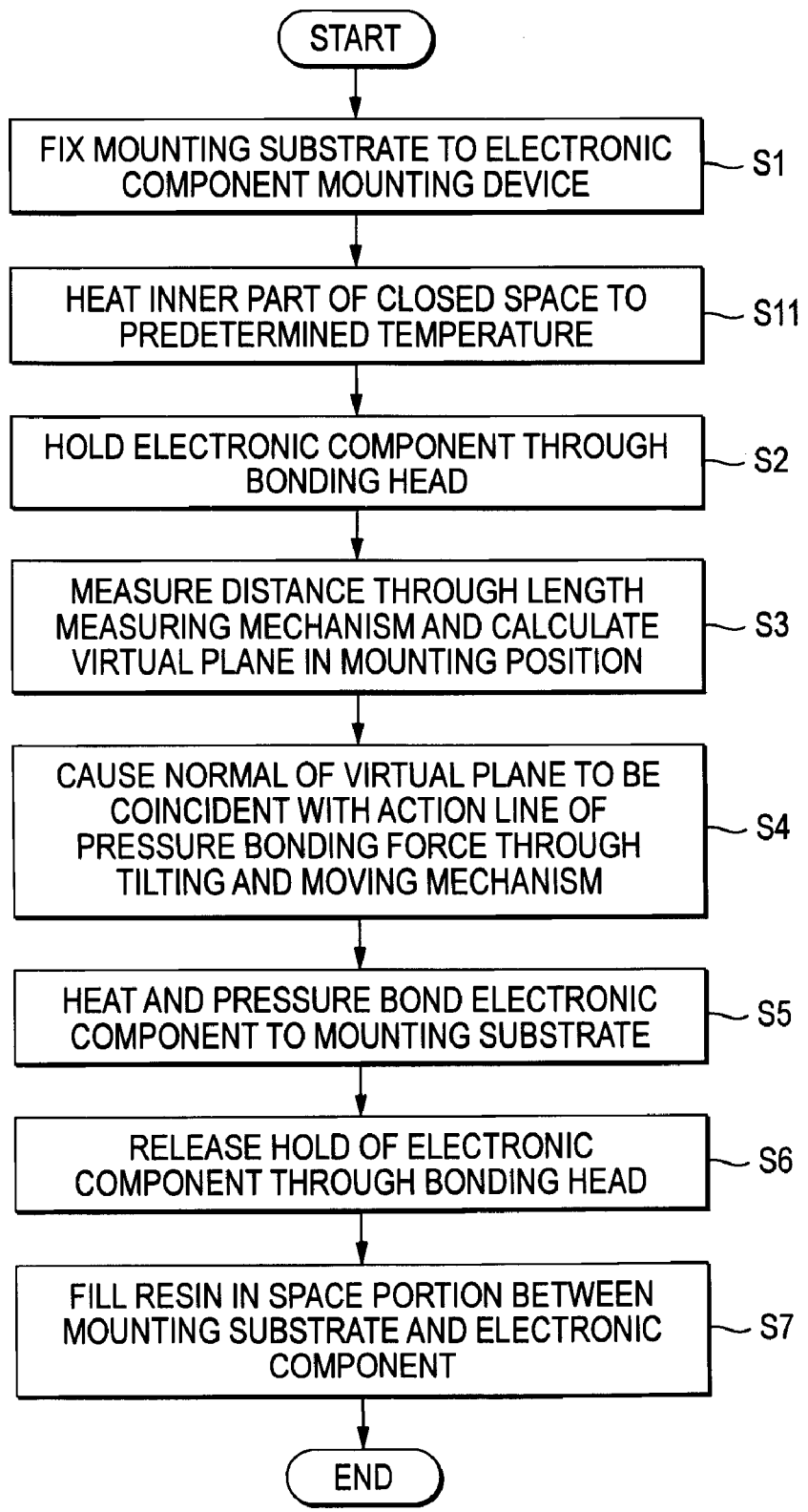
FIG. 10 is a flowchart showing a procedure for a method of manufacturing an electronic device using the electronic component mounting device in FIG. 9.
Figure 11:
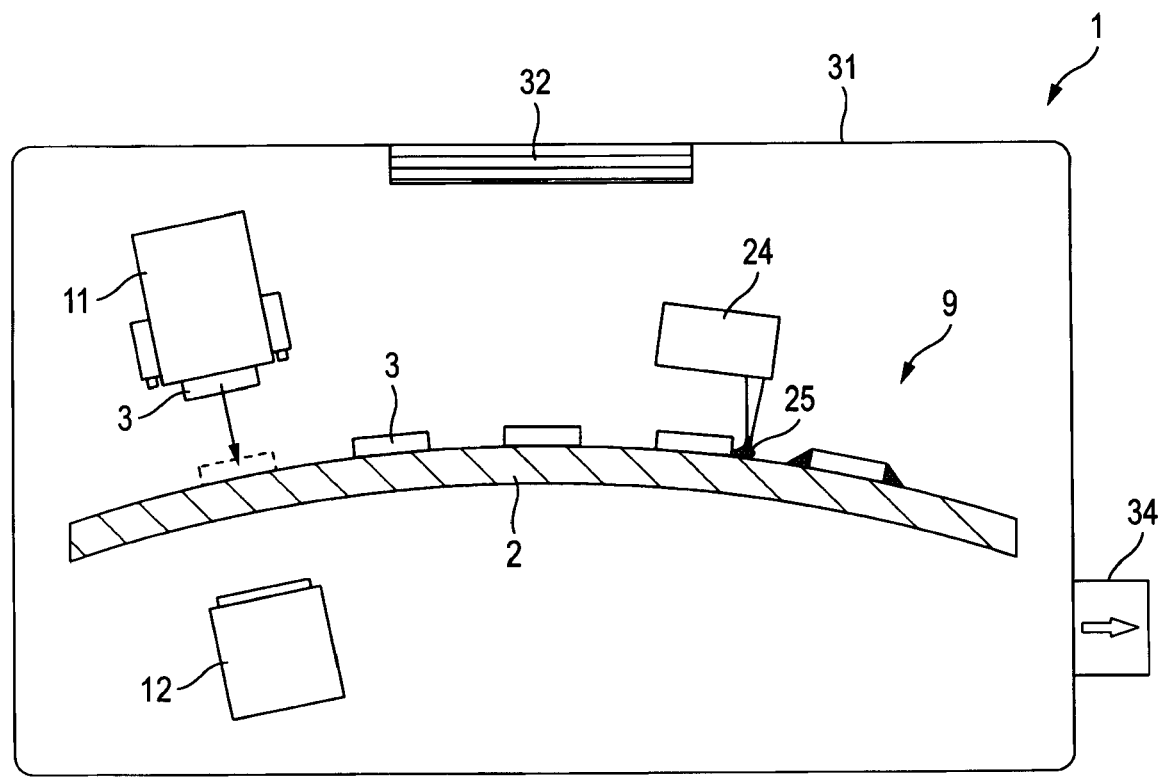
FIG. 11 is a schematic view showing an example of an electronic component mounting device according to a fifth embodiment of the invention.
Figure 12:
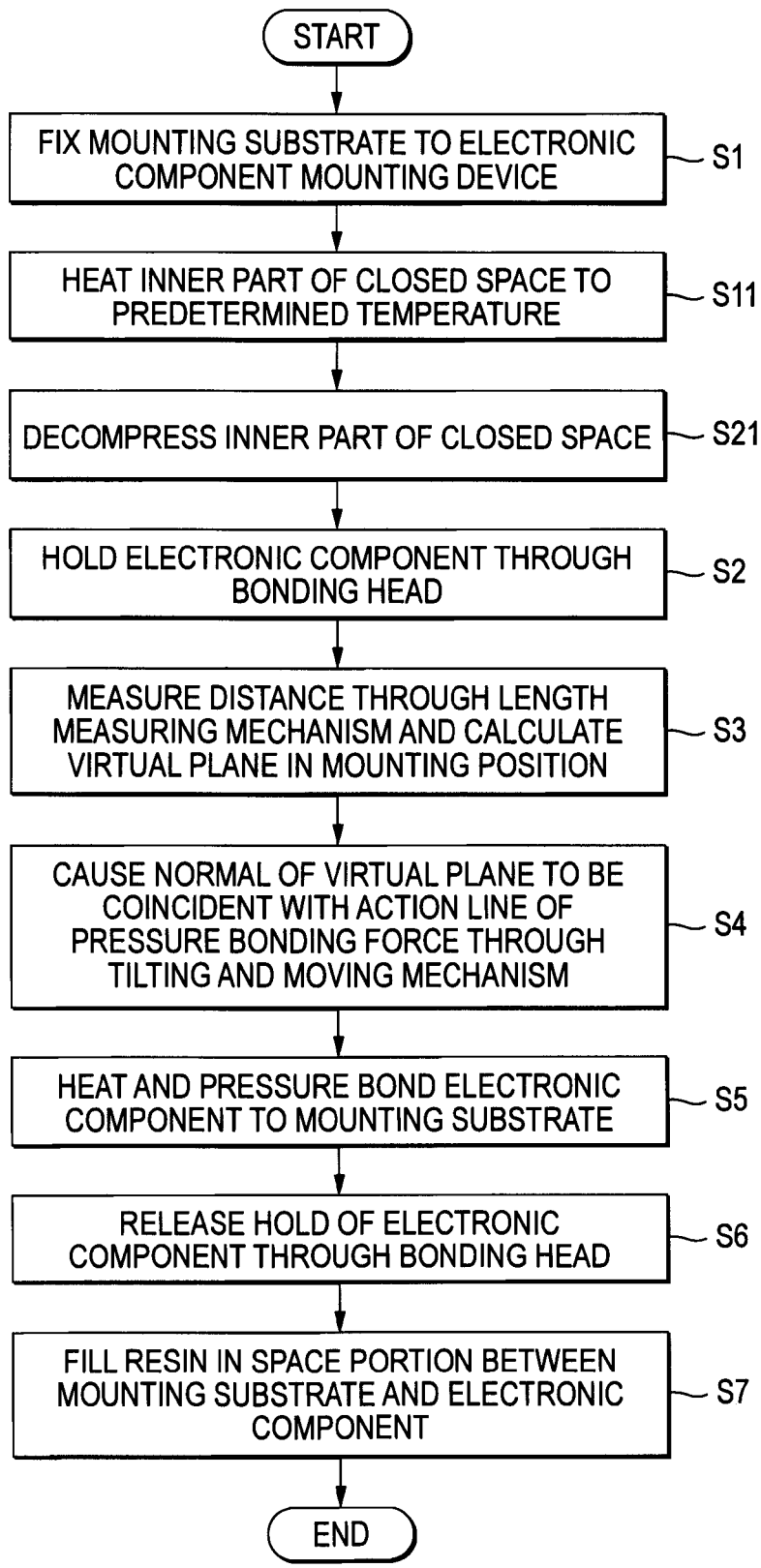
FIG. 12 is a flowchart showing a procedure for a method of manufacturing an electronic device using the electronic component mounting device in FIG. 11.
Figure 13:
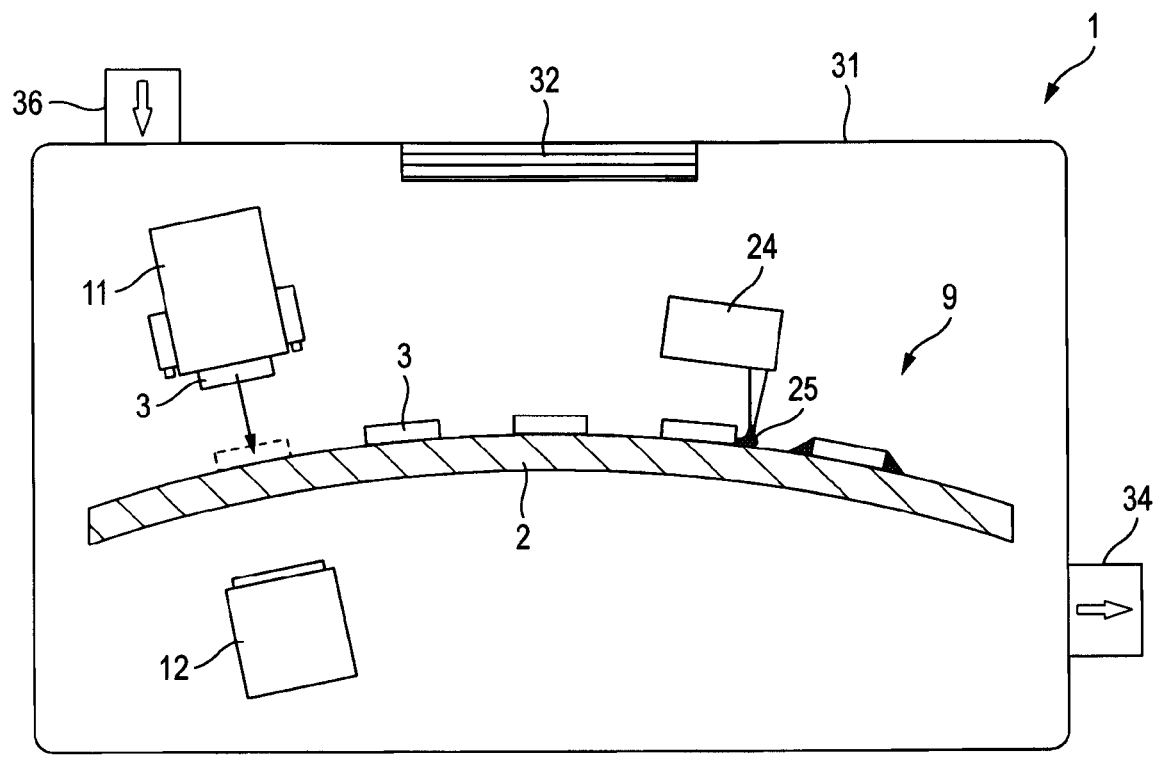
FIG. 13 is a schematic view showing an example of an electronic component mounting device according to a sixth embodiment of the invention.
Figure 15A:
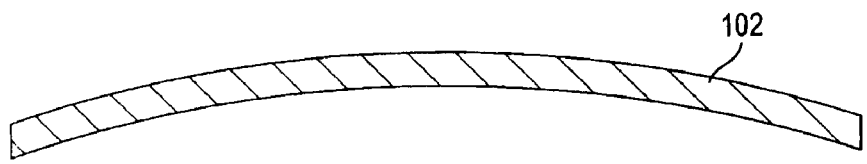
FIGS. 15A to 15C are views for explaining an example of a method of manufacturing an electronic device according to a conventional embodiment.
Figure 15B:
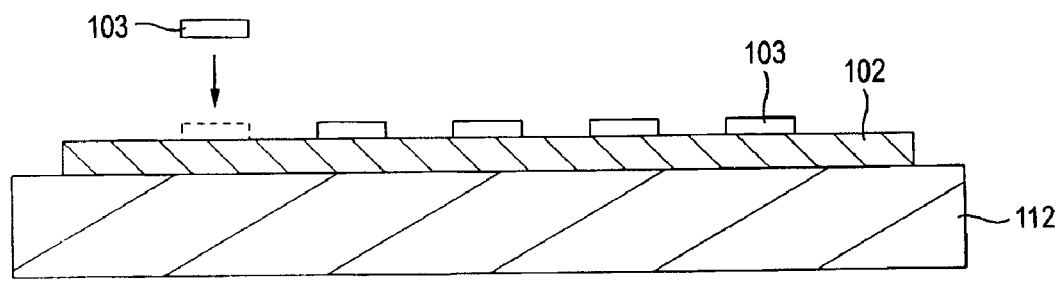
Figure 15C:
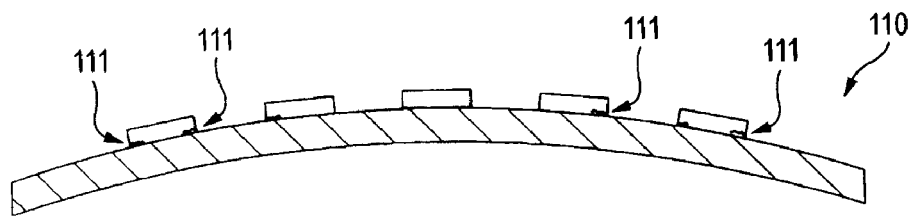
Figure 16:
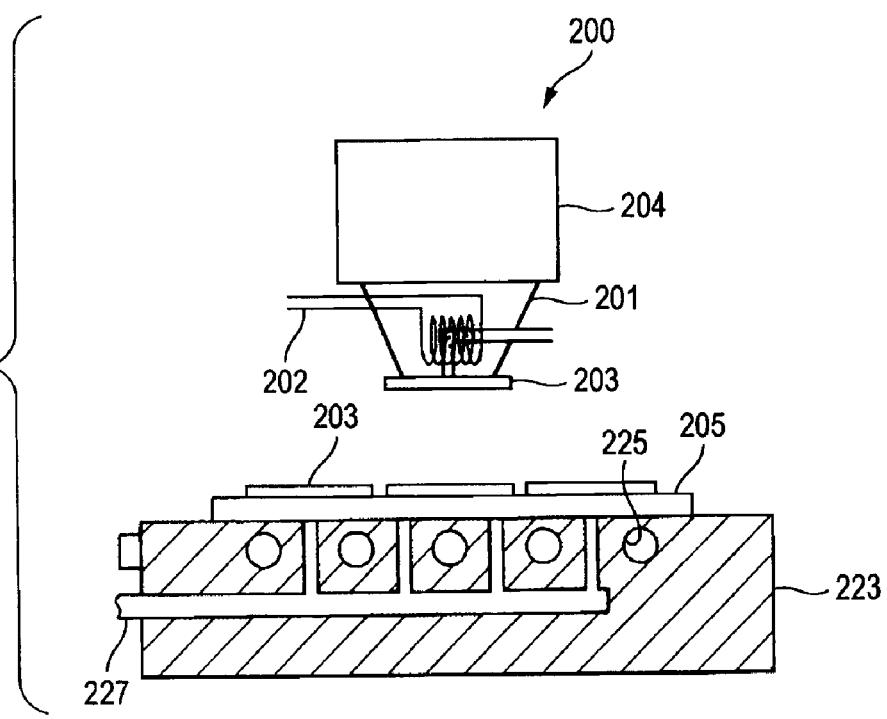
FIG. 16 is a schematic view showing an example of an electronic component mounting device according to a conventional embodiment.

An embodiment according to the invention will be described below in detail with reference to the drawings. FIG. 1 is a schematic view showing an example of an electronic component mounting device 1 according to an embodiment of the invention. FIGS. 2A to 2D are views for explaining an action of the electronic component mounting device 1 in FIG. 1. FIG. 3 is a flowchart showing a procedure for a method of manufacturing an electronic device using the electronic component mounting device 1 in FIG. 1. FIG. 4 is a schematic view showing an example of an electronic component mounting device 1 according to a second embodiment of the invention. FIGS. 5A and 5B are views for explaining an action of the electronic component mounting device 1 in FIG. 4. FIG. 6 is a flowchart showing a procedure for a method of manufacturing an electronic device using the electronic component mounting device 1 in FIG. 4. FIG. 7 is a schematic view showing an example of an electronic component mounting device 1 according to a third embodiment of the invention. FIG. 8 is a flowchart showing a procedure for a method of manufacturing an electronic device using the electronic component mounting device 1 in FIG. 7. FIG. 9 is a schematic view showing an example of an electronic component mounting device 1 according to a fourth embodiment of the invention. FIG. 10 is a flowchart showing a procedure for a method of manufacturing an electronic device using the electronic component mounting device 1 in FIG. 9. FIG. 11 is a schematic view showing an example of an electronic component mounting device 1 according to a fifth embodiment of the invention. FIG. 12 is a flowchart showing a procedure for a method of manufacturing an electronic device using the electronic component mounting device 1 in FIG. 11. FIG. 13 is a schematic view showing an example of an electronic component mounting device 1 according to a sixth embodiment of the invention. FIG. 14 is a flowchart showing a procedure for a method of manufacturing an electronic device using the electronic component mounting device 1 in FIG. 13. Referring to the designations of the drawings, 14 is generally used as 14a, 14b, . . . (the other designations are the same)

The electronic component mounting device 1 serves to sequentially mount a plurality of electronic components 3 on a mounting substrate 2. As an example of the mounting, there is taken the case in which the electronic components 3 (semiconductor chips) are flip-chip connected to the mounting substrate 2 (a mounting wiring board) one by one in a matrix. As an example, the mounting substrate 2 has an area of 150 mm×200 mm and a thickness of approximately 0.1 mm to 0.2 mm. Moreover, the electronic component 3 has an area of 12 mm×12 mm and a thickness of approximately 0.05 mm to 0.15 mm.

As shown in FIG. 1, the electronic component mounting device 1 comprises a bonding head 11, a local stage 12, a length measuring mechanism 14 and a tilting and moving mechanism 15.

The bonding head 11 includes a component holding portion 11a capable of holding the electronic component 3. For the holding mechanism, it is possible to propose a clipping mechanism and a decompressing and adsorbing mechanism.

The local stage 12 has a support surface 12a provided in a tip portion on the mounting substrate 2 side. The support surface 12a serves to locally support a region having an almost equal area to an area on which a pressure bonding force exactly acts in an acting position from an antimounting surface 2b of the mounting substrate 2 when the electronic component 3 is to be pressure bonded to the mounting substrate 2 (see FIG. 2D). Accordingly, the support surface 12a is formed in an area which is almost equal to or slightly larger than a mounting surface 3a of the electronic component 3.

Description will be given to the length measuring mechanism 14 and the tilting and moving mechanism 15 which have characteristic structures of the invention. For example, in the case in which the electronic component 3 is to be pressure bonded to the mounting substrate 2 by a normal method, that is, a simple pressure bonding action in a vertical direction in a state in which the mounting substrate 2 is warped, a load concentrates in only an end of the electronic component 3 as shown in FIG. 2A so that a deformation and breakage of the mounting substrate 2 or a connecting failure might be caused. In the invention, therefore, actions shown in FIGS. 2B to 2D are generated to solve the problem as will be described below.

Figure 2B:
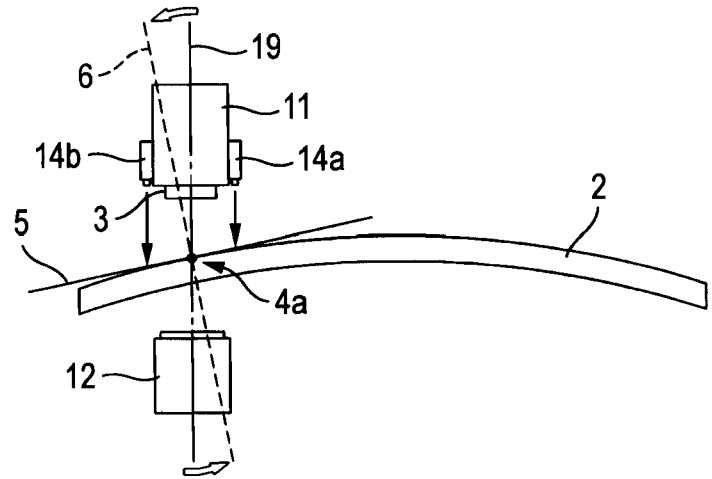

First of all, the bonding head 11 is provided with the length measuring mechanism 14 for measuring a distance between the bonding head 11 and the mounting substrate 2 and calculating a virtual plane 5 on a center 4a of a predetermined mounting position 4 on the mounting substrate (see FIG. 2B). As an example, the length measuring mechanism 14 is constituted by three or four laser type length measuring devices 14a, 14b, . . . . A contact type length measuring device may be used.

Figure 2C:
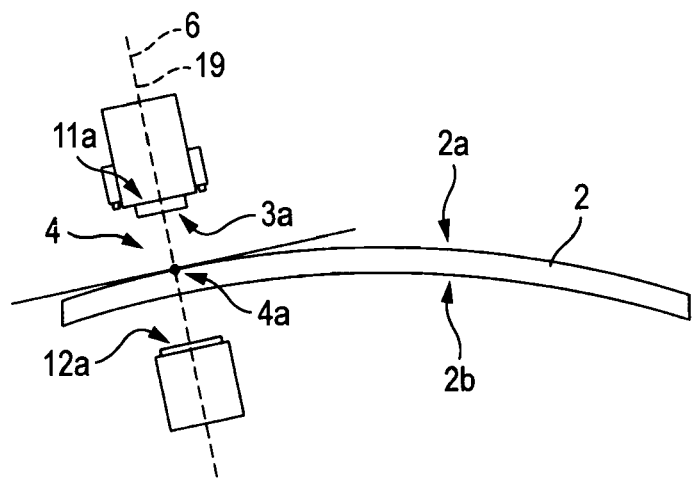

Furthermore, the tilting and moving mechanism 15 tilts and moves the bonding head 11 and the local stage 12 in such a manner that a normal 6 of the virtual plane 5 on the center 4a of the mounting position 4 is coincident with an action line 19 of the pressure bonding force (see FIG. 2C). The tilting and moving mechanism 15 is constituted by a rotating mechanism 16, a vertical moving mechanism 17 and a horizontal moving mechanism 18. As an example, the rotating mechanism 16 includes two rotating axes which are orthogonal to each other and can rotate and tilt the bonding head 11 and the local stage 12 in an x-z plane and a y-z plane. Moreover, the vertical moving mechanism 17 generates an action for moving the bonding head 11 and the local stage 12 in a vertical direction (a z-axis direction) and the horizontal moving mechanism 18 generates an action for moving the bonding head 11 and the local stage 12 in a horizontal direction (a y-axis direction). For the moving mechanism, it is possible to propose a structure using a combination of a servomotor 18a and a ball screw 18b, for example. It is also possible to employ a structure in which a plane (x-y plane) movement as well as a straight (y-axis) movement can be carried out.

Figure 2D:
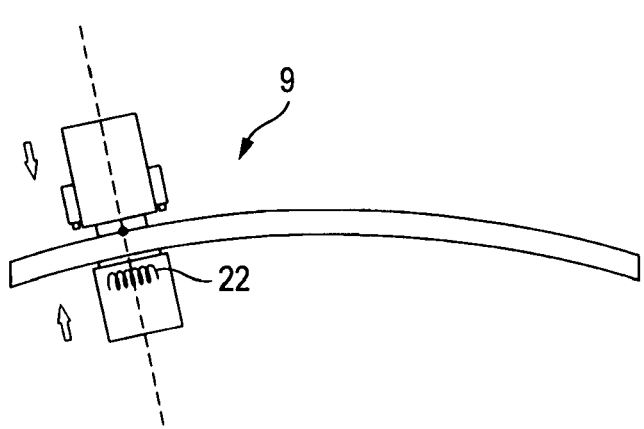

In that state, the bonding head 11 and the local stage 12 are operated to approach each other through a clamping mechanism 10 (10a and 10b) so that the electronic component 3 and the mounting substrate 2 are pressure bonded to each other (see FIG. 2D). The clamping mechanism 10 is constituted as a mechanism for operating the bonding head 11 and the local stage 12 independently of each other or in relation to each other over the action line 19 of the pressure bonding force.

Also in the case in which the warpage is generated on the mounting substrate 2, thus, the electronic component 3 and the mounting substrate 2 can be pressure bonded to each other along the normal 6 of the virtual plane 5 on the center 4a of the mounting position 4 depending on the state of the warpage.

In the case in which the electronic component 3 (the semiconductor chip) is flip-chip connected to the mounting substrate 2 (the mounting wiring board), it is necessary to heat at least one of the mounting substrate 2 and the electronic component 3. For this reason, the electronic component mounting device 1 has such a structure as to comprise at least one of a heater for heating an electronic component which is provided in the bonding head 11 and a heater for heating a mounting substrate which is provided in the local stage 12. In the example, there is employed a structure in which the local stage 12 includes a heater 22. The heater 22 is a heat wire heater, for example.

As described above, according to the electronic component mounting device 1 in accordance with the invention, it is possible to omit a mechanism for decompressing and adsorbing or electrostatically adsorbing a mounting substrate which is provided in a conventional device. More specifically, also in the case in which a warpage of the mounting substrate does not need to be corrected through an adsorption but is generated, it is possible to pressure bond the electronic component 3 and the mounting substrate 2 to each other along the normal 6 of the virtual plane 5 on the center 4a of the mounting position 4 depending on a warping state. Accordingly, it is possible to prevent a breakdown and breakage of a flip-chip connecting portion from being caused by a warpage recovery in the release of the adsorption of the mounting substrate.

Next, description will be given to the procedure for the method of manufacturing an electronic device according to the invention which is executed by using the electronic component mounting device 1. FIG. 3 is a flowchart showing the procedure. An electronic device 9 is shown in a state in which it has not been divided into pieces (see FIG. 2D).

First of all, as shown in FIG. 3, the mounting substrate 2 is fixed into a predetermined position through a fixing mechanism (not shown) of the electronic component mounting device 1 at Step S1.

At Step S2, subsequently, the electronic component 3 is held by the bonding head 11. In that case, an operation is carried out by decompressing and adsorbing the electronic component 3 accommodated in a housing rack (not shown) through the component holding portion 11a in a tip portion of the bonding head 11 as an example.

At Step S3, then, the distance between the bonding head 11 and the mounting substrate 2 is measured in a plurality of places through the length measuring mechanism 14, thereby calculating the virtual plane 5 on the center 4a of the predetermined mounting position 4 on the mounting substrate 2 (see FIG. 2B).

At Step S4, thereafter, the normal 6 of the virtual plane 5 on the center 4a of the mounting position 4 is caused to be coincident with the action line 19 for causing a pressure bonding force to act at a next step (see FIG. 2C). The operation is carried out by tilting and moving the bonding head 11 and the local stage 12 through the tilting and moving mechanism 15, that is, the rotating mechanism 16, the vertical moving mechanism 17 and the horizontal moving mechanism 18. As an example, the rotating mechanism 16 is constituted to include a first rotating mechanism 16a capable of rotating the bonding head 11 and the local stage 12 in the y-z plane and a second rotating mechanism 16b capable of rotating them in the x-z plane.

At Step S5, next, the bonding head 11 and the local stage 12 are operated to approach each other along the normal 6 through the clamping mechanism 10 so that the electronic component 3 and the mounting substrate 2 are pressure bonded to each other (see FIG. 2D). In the example, the pressure bonding operation is carried out in a state in which the mounting substrate 2 is heated by the heater 22 for heating a mounting substrate which is provided in the local stage 12. As an example, a heating temperature is set to be approximately 60 to 150° C. and a pressure bonding state is maintained for a predetermined time to carry out the heating and pressure bonding operations. When the electronic component 3 is to be pressure bonded to the mounting substrate 2, the positions and operations of the bonding head 11 and the local stage 12 are controlled in such a manner that a pressure bonding force for pressing a mounting surface 2a of the mounting substrate 2 by the electronic component 3 through the bonding head 11 is supported in a corresponding position at the antimounting surface 2b side of the mounting substrate 2 through the support surface 12a in the tip portion on the mounting substrate 2 side of the local stage 12.

At Step S6, finally, the hold of the electronic component 3 through the bonding head 11 is released. Consequently, the electronic component 3 is completely mounted on the mounting substrate 2 and the processing proceeds to a succeeding manufacturing process.

According to the method of manufacturing an electronic device in accordance with the invention, thus, in the case in which a plurality of electronic components is sequentially mounted on a mounting substrate, it is possible to pressure bond the electronic component 3 to the mounting substrate 2 along the normal 6 of the virtual plane 5 on the center 4a of the mounting position 4 depending on a state of a warpage even if the warpage is caused by a formation of the mounting substrate 2 as a thin plate-shaped printed board. Consequently, it is possible to prevent a breakdown and breakage of the flip-chip connecting portion from being caused by a warpage recovery in the release of the adsorption of the mounting substrate which is a conventional problem. As a result, it is possible to reduce a ratio of a defective product of an electronic device to be manufactured, thereby maintaining high quality.

Next, description will be given to a second embodiment of the electronic component mounting device 1 according to the invention.

As shown in FIGS. 4 and 5, the electronic component mounting device 1 comprises a resin filling mechanism 24 for filling an underfill resin (which will be hereinafter referred to as a "resin") 25 in a space portion 8 between a mounting substrate 2 and an electronic component 3 mounted on the mounting substrate 2.

The resin filling mechanism 24 includes a coating head 26 for filling the resin 25 from an outer peripheral portion into the space portion 8 formed in a state in which the electronic component 3 is heated and pressure bonded onto the mounting substrate 2. The coating head 26 is a needle or a syringe as an example and has such a structure that a tip portion 26a of the coating head 26 can be disposed in a vicinal portion of an outer periphery of the electronic component 3 on the mounting substrate 2 as shown in FIG. 5A.

Furthermore, the resin filling mechanism 24 is connected to an up-down mechanism (not shown) and a plane sliding mechanism (not shown) which are provided in the electronic component mounting device 1 and can move the coating head 26 to a desirable position with respect to the electronic components 3 disposed in a matrix on the mounting substrate 2.

With the structure, it is possible to supply the resin 25 from the coating head 26 to the vicinal portion of the outer periphery of the electronic component 3 on the mounting substrate 2. At this time, an interval between the mounting substrate 2 and the electronic component 3 is very small as described above. For this reason, the resin 25 is naturally filled in the space portion 8 by a so-called capillarity. It is also possible to employ a method of applying a pressure to the resin and filling the resin in the space portion in place of the natural filling. The resin is filled in a state in which at least one of the mounting substrate 2 and the electronic component 3 is heated. FIG. 5B shows a state in which the resin is completely filled in the space portion 8 through the resin filling mechanism 24.

With the structure, in the conventional art, a substrate having an electronic component mounted thereon is moved and delivered between a step of carrying out a flip-chip connection and a step of filling a resin, resulting in a drop in a temperature and a deformation of the mounting substrate, and the generation of a breakdown and breakage of an electronic component connecting portion. On the other hand, according to the electronic component mounting device 1 in accordance with the invention, it is possible to fill the resin in the space portion 8 through the resin filling mechanism 24 immediately after heating and pressure bonding the electronic component 3 to the mounting substrate 2. Thus, it is possible to eliminate the step of moving and delivering the mounting substrate. As a result, it is possible to prevent a drop in a temperature and a deformation of the mounting substrate which are caused by the movement and delivery and a breakdown and breakage of the electronic component connecting portion.

Next, description will be given to a procedure according to another example of the method of manufacturing an electronic device according to the invention which is executed by using the electronic component mounting device 1 in accordance with the second embodiment.

Steps S1 to S6 in FIG. 6 are the same as the steps shown in FIG. 3. As a succeeding step S7, the resin 25 is filled in the space portion 8 between the mounting substrate 2 and the electronic component 3 through the resin filling mechanism 24 in a state in which the hold of the electronic component 3 through a bonding head 11 is released and the electronic component 3 is completely mounted on the mounting substrate 2. When the resin 25 is to be filled, an atmosphere of a filling place is regulated to have a temperature of approximately 60 to 150° C. as an example. After the resin is completely filled, the processing proceeds to a succeeding manufacturing process.

The electronic component mounting device 1 according to the second embodiment can heat the mounting substrate 2 through a heater 22 for heating a mounting substrate which is provided in a local stage 12, and furthermore, is provided with the resin filling mechanism 24 and can thus fill the resin in the space portion 8 through the resin filling mechanism 24 immediately after the electronic component 3 is heated and pressure bonded to the mounting substrate 2. Differently from the conventional art, consequently, it is not necessary to deliver a mounting substrate having an electronic component mounted thereon to another step and to then carry out heating again, thereby filling a resin. Therefore, it is possible to prevent a drop in a temperature from being caused by the movement and delivery and to enhance a thermal efficiency. Furthermore, it is also possible to prevent a displacement and damage of the substrate from being caused by the movement and delivery.

Next, description will be given to a third embodiment of the electronic component mounting device 1 according to the invention.

The electronic component mounting device 1 comprises a closed space 31 capable of regulating a temperature of an internal atmosphere and has such a structure as to be provided in the closed space 31 as shown in FIG. 7. It is possible to suppose that the temperature is regulated through a temperature regulating mechanism 32 using a heat wire heater having a thermostat, for example. In order to enhance a thermal efficiency, moreover, it is suitable that the closed space 31 should have a heat insulating structure.

With the structure, it is possible to heat and pressure bond an electronic component 3 to a mounting substrate 2 in the closed space 31. As a result, by heating an inner part of the closed space 31 to a predetermined temperature through the temperature regulating mechanism 32 in addition to the heating of the mounting substrate 2 through a heater 22 provided in a local stage 12 or in place thereof, it is possible to bring a necessary heating environment for the pressure bond of the electronic component 3 to the mounting substrate 2.

The procedure for the method of manufacturing an electronic device according to the invention which is executed by using the electronic component mounting device 1 in accordance with the third embodiment is shown in a flowchart of FIG. 8. In FIG. 8, Step S11 is a step of heating the inner part of the closed space 31 to a predetermined temperature. The other steps are the same as described above and description will be omitted.

As a fourth embodiment of the electronic component mounting device 1 according to the invention, furthermore, it is possible to propose a structure in which a closed space 31 including a temperature regulating mechanism 32 and capable of regulating a temperature of an internal environment is provided and the electronic component mounting device 1 according to the second embodiment is disposed in the closed space 31 as shown in FIG. 9.

When a resin 25 is to be filled in a space portion 8, consequently, it is possible to heat a mounting substrate 2 through the temperature regulating mechanism 32 in place of a heater 22 of a local stage 12. As a result, it is possible to produce an advantage that the curing of the resin can be promoted, and furthermore, it is not necessary to carry out an individual heating control every filling place (the mounting substrate 2 and an electronic component 3). Thus, it is possible to stabilize the filling of the resin, that is, quality of an electronic device 9 to be manufactured.

The procedure for the method of manufacturing an electronic device according to the invention which is executed by using the electronic component mounting device 1 in accordance with the fourth embodiment is shown in a flowchart of FIG. 10. In FIG. 10, each step is the same as described above and description will be omitted.

As a fifth embodiment of the electronic component mounting device 1 according to the invention, moreover, it is possible to propose a structure in which the closed space 31 in the electronic component mounting device 1 according to the fourth embodiment includes a decompressing mechanism 34 for decompressing an inner part as shown in FIG. 11.

With the structure, the inner part of the closed space 31 can be brought into a decompressing state, and furthermore, a resin 25 can be filled in a space portion 8 between a mounting substrate 2 and an electronic component 3. As a result, it is possible to prevent a void from being contained in the resin 25 to be filled in the space portion 8 and to prevent a damage such as a breakdown of a connecting portion from being caused by the void, thereby stabilizing the quality of an electronic device 9.

The procedure for the method of manufacturing an electronic device according to the invention which is executed by using the electronic component mounting device 1 in accordance with the fifth embodiment is shown in a flowchart of FIG. 12. In FIG. 12, Step S21 is a step of decompressing the inner part of the closed space 31. The other steps are the same as described above and description will be omitted.

As a sixth embodiment of the electronic component mounting device 1 according to the invention, moreover, it is possible to propose a structure in which the closed space 31 in the electronic component mounting device 1 according to the fifth embodiment includes a gas supplying mechanism 36 for supplying an inert gas to an inner part as shown in FIG. 13. $N_2$, Ar or Ne is used for the inert gas.

With the structure, it is possible to pressure bond an electronic component 3 to a mounting substrate 2 while decompressing the inner part of the closed space 31 and supplying the inert gas to the inner part. As a result, it is possible to prevent a surface of a solder to be flip-chip connected, for example, a solder pad of the mounting substrate 2 or a solder ball of the electronic component 3 from being oxidized and to maintain a wettability of the solder, thereby carrying out a reliable connection. Thus, it is possible to stabilize the quality of the electronic device.

The procedure for the method of manufacturing an electronic device according to the invention which is executed by using the electronic component mounting device 1 in accordance with the sixth embodiment is shown in a flowchart of FIG. 14. In FIG. 14, Step S31 is a step of supplying the inert gas into the closed space 31. The other steps are the same as described above and description will be omitted.

Although each of the examples has been described above, it is possible to enhance the mounting number (manufacturing number) per unit time by employing such a structure as to include a plurality of electronic component mounting devices 1 or mechanism portions to be provided as their variants.

As described above, according to the electronic component mounting device and the method of manufacturing an electronic device in accordance with the invention, in the case in which a plurality of electronic components is sequentially mounted on a mounting substrate, it is possible to pressure bond and mount them while maintaining mounting surfaces of the electronic components to be almost parallel with a mounting surface of the corresponding mounting substrate with the mounting substrate warped without correcting the warpage of the mounting substrate through an adsorption even if the warpage is generated on the mounting substrate. As a result, it is possible to prevent a breakdown and breakage of the flip-chip connecting portion from being caused by a warpage recovery in the release of the adsorption of the mounting substrate.

By the structure having the resin filling mechanism, furthermore, it is possible to fill the resin in the space portion through the resin filling mechanism immediately after heating and pressure bonding the electronic component to the mounting substrate, thereby eliminating the step of moving and delivering the mounting substrate. As a result, it is possible to prevent a drop in a temperature and a deformation of the mounting substrate, and a breakdown and breakage of the electronic component connecting portion from being caused by the movement and delivery.

In addition, at the step of mounting the electronic component which is to be carried out by heating the whole mounting substrate according to the conventional art, the mounting substrate has a high temperature. In the case in which the underfill resin is filled at the same time, therefore, there is a problem in that a filling failure is caused by the curing of the underfill resin. On the other hand, in the invention, the mounting substrate is not heated wholly but locally to connect the electronic component thereto. Consequently, it is possible to carry out the step of filling the underfill resin and the step of mounting the electronic component at the same time without causing the problem.

Thus, the invention can reduce a ratio of a defective product of an electronic device to be manufactured, thereby maintaining high quality.

While the description has been given by taking the electronic device through the flip-chip connection as an example, it is a matter of course that technical thought according to the invention is applied to other electronic devices.

What is claimed is:

1. A method of using an electronic device which sequentially mounts a plurality of electronic components to a single stationary mounting substrate, comprising the steps of:
    measuring a distance between a bonding head for holding and pressure bonding the electronic components to the mounting substrate and the mounting substrate to calculate a virtual plane in a predetermined mounting position on the mounting substrate,
    simultaneously tilting and moving in a point symmetry relationship relative to the stationary mounting substrate both the bonding head and a local stage for supporting a pressure bonding force from an antimounting surface of the mounting substrate to cause a normal of the virtual plane in the mounting stationary position to be coincident with an action line of the pressure bonding force, and
    carrying out the pressure bonding along the normal.

2. The method of using the electronic device according to claim 1, wherein
    the step of carrying out the pressure bonding is executed in at least one of a state in which the electronic component is heated through the bonding head and a state in which the mounting substrate is heated through the local stage.

3. The method of using the electronic device according to claim 1, wherein
    a step of filling a resin in a space portion between the mounting substrate and the electronic component mounted on the mounting substrate is executed subsequently to the step of carrying out the pressure bonding in a closed space in which an internal atmosphere is regulated to have a predetermined temperature.

4. The method of using the electronic device according to claim 3, wherein an inner part of the closed space is set in a decompressing state.

5. The method of using the electronic device according to claim 1, wherein the step of carrying out the pressure bonding along the normal further comprises:

pressing a support surface of the local stage into the antimounting surface of the mounting substrate at the mounting position, wherein the support surface has an area that is substantially equal to an area of a mounting surface of the electronic component.

6. The method of using the electronic device according to claim 1, wherein the step of carrying out the pressure bonding along the normal further comprises:

pressing the bonding head with the electronic component to the mounting substrate at the mounting position in a direction that is coincident with the normal; and pressing the local stage into the antimounting surface of the mounting substrate at the mounting position in a direction that is coincident with the normal.

* * * * *